United States Patent
Kawaguchi et al.

(10) Patent No.: US 6,852,791 B2
(45) Date of Patent: Feb. 8, 2005

(54) ANTI-REFLECTION COATING FORMING COMPOSITION

(75) Inventors: Kazuo Kawaguchi, Yokkaichi (JP); Masato Tanaka, Yokkaichi (JP); Tsutomu Shimokawa, Suzuka (JP)

(73) Assignee: JSR Corporation, Tokyo (JP)

( * ) Notice: Subject to any disclaimer, the term of this patent is extended or adjusted under 35 U.S.C. 154(b) by 630 days.

(21) Appl. No.: 09/987,367

(22) Filed: Nov. 14, 2001

(65) Prior Publication Data
US 2002/0086934 A1 Jul. 4, 2002

(30) Foreign Application Priority Data
Nov. 14, 2000 (JP) ........................................ 2000-347188

(51) Int. Cl.⁷ ................................................ C08K 3/00
(52) U.S. Cl. ........................ 524/553; 524/551; 524/567; 524/599; 524/606; 524/609; 524/611; 524/612
(58) Field of Search ................................. 524/551, 553, 524/567, 599, 606, 609, 611, 612

(56) References Cited

U.S. PATENT DOCUMENTS 5,482,817 A    1/1996   Dichiara et al.

FOREIGN PATENT DOCUMENTS

| JP | 59-93448   | 5/1984 |
| JP | 2000143937 | 5/2000 |
| JP | 2001040293 | 2/2001 |
| JP | 2001192539 | 7/2001 |

*Primary Examiner*—Edward J. Cain
(74) *Attorney, Agent, or Firm*—DLA Piper Rudnick Gray Cary U.S. LLP; Steven B. Kelber

(57) ABSTRACT

An anti-reflection coating-forming composition is provided. This composition includes a polymer and a solvent. The polymer has a structural unit represented by the formula (1):

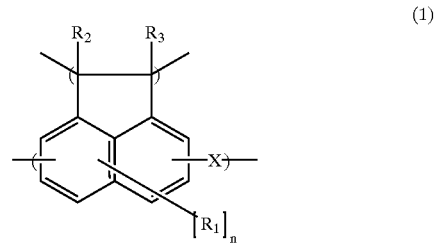

(1)

wherein $R_1$ is a monovalent atom other than a hydrogen atom or a monovalent group, and n is an integer of 0–4, provided that when n is an integer of 2–4, a plural number of $R_1$'s are the same or different; $R_2$ and $R_3$ are each a monovalent atom or group; and X is a bivalent group. The anti-reflection coating formed from this composition has a high antireflective effect, does not generate intermixing with a resist film, and enables a good resist pattern profile excellent in resolution and precision in cooperation with a positive or negative resist.

12 Claims, No Drawings

ANTI-REFLECTION COATING FORMING COMPOSITION

BACKGROUND OF THE INVENTION

1. Field of the Invention

The present invention relates to an anti-reflection coating composition which is useful for minute processing in the lithography process employing various kinds of radiation, and is especially preferred for the production of integrated circuit chips.

2. Description of the Prior Art

In the manufacturing processes of integrated circuit chips, in order to obtain higher integration, there has been progress in making the processing size to be minute in the lithography process. In the lithography process, a resist composition solution is applied on a substrate, and the masking pattern is transcribed by a reduction projection exposure system (stepper), and it is developed with an appropriate developer to obtain a desired pattern. However, the substrate with high reflectivity used in this process such as aluminum, aluminum-silicon alloy and aluminum-silicon-copper alloy, polysilicon, and tungsten silicide reflects radiation on the surface. There has been the problem that halation occurs in the resist pattern due to this influence and that a minute resist pattern cannot be reproduced precisely.

In order to overcome this problem, it is proposed to install an anti-reflection coating which has a nature of absorbing radiation reflected from the substrate under the resist film to be formed on the substrate. As such an anti-reflection coating, known are inorganic coatings such as titanium coating, titanium dioxide coating, titanium nitride coating, chromium oxide coating, carbon coating, and α-silicon coating formed by methods such as vacuum coating, CVD, and sputtering. However, because these inorganic anti-reflection coatings have conductivity, there has been the shortcoming that they can not be used for manufacturing integrated circuits and requires special apparatuses, such as a vacuum evaporator, a CVD apparatus, and a sputtering apparatus for forming an anti-reflection coating. In order to overcome the shortcoming of inorganic anti-reflection coating, in Japanese Laid-open publication (Kokai) No. 59-93448 Public Report proposed is an organic anti-reflection coating made of polyamic acid (co)polymer or polysulfone (co)polymer and a dye. Because the anti-reflection coating has no electric conductivity and the composition constituting this anti-reflection coating dissolves in an appropriate solvent, it can be applied onto a substrate in the form of solution without any special device as in the case of the formation of a photoresist film.

SUMMARY OF THE INVENTION

However, there is the problem that, because an anti-reflection coating made of a the (co)polymer of a polyamic acid or a polysulfone and a dye has a restriction in the amount of dye added, halation and standing wave cannot be sufficiently prevented, and also because it mixes with the resist a little (known as intermixing), there is the occurrence of degradation of the resist pattern profile (i.e., the shape of the resist pattern in vertical section) such as insufficient cut-out and skirt dragging. The objective of the present invention is to overcome the conventional problems and to provide an anti-reflection coating-forming composition which has a high anti-reflection effect, does not cause intermixing, and which can form a resist pattern which has excellent resolution, precision, and the like.

The inventors, through repeated zealous investigation, have discovered that polymers containing an acenaphthylene as a monomer unit have high absorbance to excimer laser light and a high refractive index compared with conventional lower-layer anti-reflection coating, leading to the creation discovery of the present invention. Namely, the present invention provides an anti-reflection coating-forming composition comprising a polymer and a solvent, said polymer having the structural unit represented by the following formula (1):

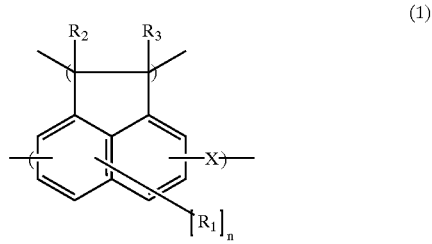

wherein $R_1$ is a monovalent atom other than a hydrogen atom or a group, and n is an integer of 0–4, provided that if n is an integer of 2–4, a plural number of $R_1$'s can be either the same or different; $R_2$ and $R_3$ are independently a monovalent atom or group; and X is a bivalent group.

DESCRIPTION OF THE PREFERRED EMBODIMENTS

The present invention is now described in detail. The "(meth)acryl" in words such as (meth)acrylonitrile, (meth)acrylate, (meth)acrylamide, and the like herein means "acryl" and/or methacryl.

[Basic Polymers]

The polymers (called polymer (A) below) having the structural unit represented by the general formula (1) are the basic components of the composition of this invention.

In the general formula (1), $R_1$ is a monovalent atom (where a hydrogen atom is excluded) or a group, including, for example, a halogen atom, alkyl group, alkenyl group, nitro group, amino group, hydroxyl group, phenyl group, acyl group, carboxyl group, sulfonic acid group, mercapto group, etc. As the alkyl group, a straight-chain or branched-chain alkyl group with 1–6 carbon atoms is preferred, including e.g., methyl, ethyl, propyl, isopropyl, butyl, isobutyl, tert-butyl, etc. As the alkenyl group, a straight-chain or branched-chain alkenyl group with 2–6 carbon atoms is preferred, including e.g., vinyl, allyl, etc. As the halogen atom, fluorine, chlorine, and bromine are preferred. Also, as the acyl group, an aliphatic acyl group or an aromatic acyl group with 1–6 carbon atoms is preferred, including an acetyl group, and the like. As the amino group, the first grade amino group is preferred.

The $R_2$ and $R_3$ are monovalent atoms or groups, and as the monovalent atom or group a hydrogen atom and those listed above as examples of $R_1$ can be listed for example. Also, X is a bivalent group, including, for example, —CO—, —NH—, —SO$_2$—, —S—, —O—, —COO—, —CONH—, —O—CO—O—, —NH—CO—NH—, —Si(R)$_2$— where R's each stand for a straight chain or branched alkyl group with 1–6 carbon atoms, a straight chain or branched alkenyl group with 2–6 carbon atoms, an alicyclic group with 4–10 carbon atoms, an aromatic hydrocarbon group with 6–12 carbon atoms, or a 4–10 membered cyclic group, —Si(R)$_2$—O— where R's are as defined above, etc. Out of them, preferred are —CO—, —O—, —COO— and —CONH—.

The polymer (A) includes, as a specific example of the polymer (A), a polymer having the structure represented by the following general formula (2):

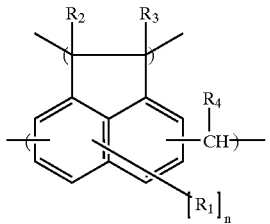
(2)

wherein $R_1$–$R_3$ and n are as described above, and $R_4$ indicates a hydrogen atom or a monovalent organic group.

Here, the monovalent organic group indicated by $R_4$ includes, for example, a straight-chain or branched-chain alkyl group with 1–6 carbon atoms, a straight-chain or branched-chain alkenyl group with 2-6 carbon atoms, an alicyclic group with 4–10 carbon atoms, an aromatic hydrocarbon group with 6–12 carbon atoms, a heterocyclic group with 4–10 members, etc.

The alkyl group indicated by $R_4$ includes, e.g., methyl, ethyl, propyl, isopropyl, butyl, isobutyl, tert-butyl, etc. The alkenyl group includes, e.g., vinyl group, propenyl group, 1-butenyl group, 2-butenyl group, etc. The alicyclic group includes, e.g., cyclohexyl group. The aromatic hydrocarbon group includes, e.g., phenyl group, naphthyl group, anthryl group, etc. The heterocyclic group includes, e.g., the furfuryl group, etc. Here, the structural unit shown by the general formula (2) in the polymer (A) preferably accounts for 5–20 mol % relative to the whole structural units having the general formula (1).

[Synthesis Process]

In this invention, the polymer (A) can be obtained by the process described below for example. Here, although two kinds of synthesis processes are listed, it is not limited to these processes.

(Synthesis Process 1)

This is a process which includes a step (a) of homopolymerizing an acenaphthylene or copolymerizing it with another copolymerizable monomer to produce a precursor polymer having the structural unit represented by the following formula (3), and a step(b) of further cocondensing the precursor polymer with an aldehyde in the presence of an acid catalyst or cocondensing it with another cocondensable component to obtain the polymer (A).

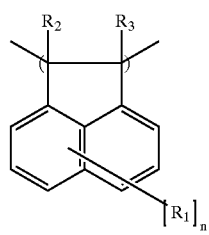
(3)

wherein $R_1$–$R_3$ and n are as described above.

Step(a):

First, a precursor polymer having the structural unit represented by the above formula (3) is obtained by monopolymerizing an acenaphthylene or copolymerizing it with another copolymerizable monomer.

As the acenaphthylene group used for synthesizing the precursor polymer, listed as examples are acenaphthylene; alkylacenaphthylenes such as 1-methylacenaphthylene, 3-methylacenaphthylene, 4-methylacenaphthylene, 5-methylacenaphthylene, 1-ethylacenaphthylene, 3-ethylacenaphthylene, 4-ethylacenaphthylene, and 5-ethylacenaphthylene; halogenated acenaphthylenes such as 1-chloroacenaphthylene, 3-chloroacenaphthylene, 4-chloroacenaphthylene, 5-chloroacenaphthylene, 1-bromoacenaphthylene, 3-bromoacenaphthylene, 4-bromoacenaphthylene, and 5-bromoacenaphthylene; nitroacenaphthylenes such as 1-nitroacenaphthylene, 3-nitroacenaphthylene, 4-nitroacenaphthylene, and 5-nitroacenaphthylene; aminoacenaphthylenes such as 1-aminoacenaphthylene, 3-aminoacenaphthylene, 4-aminoacenaphthylene, and 5-aminoacenaphthylene; phenylacenaphthylenes such as 1-phenylacenaphthylene, 3-phenylacenaphthylene, 4-phenylacenaphthylene, and 5-phenylacenaphthylene; mercaptoacenaphthylenes such as 1-mercaptoacenaphthylene, 3-mercaptoacenaphthylene, 4-mercaptoacenaphthylene, and 5-mercaptoacenaphthylene; hydroxyacenaphthylenes such as 1-hydroxyacenaphthylene, 3-hydroxyacenaphthylene, 4-hydroxyacenaphthylene, and 5-hydroxyacenaphthylene; and acenaphthylene carboxylic acids such as acenaphthylene-1-carboxylic acid, acenaphthylene-3-carboxylic acid, acenaphthylene-4-carboxylic acid, and acenaphthylene-5-carboxylic acid. These can be used as a single kind alone or two kinds or more mixed.

As the monomer copolymerizable with an acenaphthylene constituting the precursor polymer, listed as examples are styrene; substituted styrene compounds such as α-methylstyrene, o-methylstyrene, m-methylstyrene, p-methylstyrene, o-hydroxystyrene, m-hydroxystyrene, p-hydroxystyrene, o-acetoxystyrene, m-acetoxystyrene, p-acetoxystyrene, and p-t-butoxystyrene; vinyl carboxylates such as vinyl acetate, vinyl propionate, and vinyl caproate; vinyl cyanide compounds such as (meth)acrylonitrile, and α-chloroacrylonitrile; unsaturated carboxylic esters such as methyl (meth)acrylate, ethyl (meth)acrylate, n-propyl (meth)acrylate, n-butyl (meth)acrylate, n-hexyl (meth) acrylate, and glycidyl (meth)acrylate; unsaturated group-containing unsaturated carboxylic esters such as ethyleneglycol di(meth)acrylate, propyleneglycol di(meth)acrylate, and vinyl (meth)acrylate, dimethylvinyl methacryloyloxymethylsilane; halogen-containing vinyl compounds such as 2-chloroethyl vinyl ether, vinyl chloroacetate, and allyl chloroacetate; hydroxyl group-containing vinyl compounds such as 2-hydroxylethyl (meth)acrylate, 2-hydroxylpropyl (meth)acrylate, and (meth)allyl alcohol; amide group-containing vinyl compounds such as (meth)acrylamide and crotonylamide; carboxyl group-containing vinyl compounds such as 2-methachroyl oxyethylsuccinic acid and 2-methachroyloxyethylmaleic acid; and vinylaryl compounds such as 1-vinylnaphthalene, 2-vinylnaphthalene, 9-vinylanthracene, and 9-vinylcarbazole. These monomers can be used singly or as a mixture of two or more.

In regard to the proportion of the acenaphthylene and the copolymerizable monomer constituting the precursor polymer, the acenaphthylene should be contained preferably in an amount of 5–100 mol % relative to the total molar amount of the two, more preferably 10–100 mol %, and even more preferably 20–100 mol %.

Although the molecular weight of the precursor polymer is selected appropriately according to the desired characteristics of the anti-reflection coating, the average molecular weight in terms of polystyrene (called "Mw" below) is usually 500–10,000, and preferably 1,000–5,000.

The precursor polymer can be manufactured in a polymerization way such as solution polymerization by an appropriate method such as radical polymerization, anion polymerization, on cation polymerization.

Step(b):

Next, the precursor polymer and the aldehyde are condensed to obtain the polymer (A) having the structural unit represented by the formula (1).

As the aldehyde used for condensation reaction, listed as examples are saturated aliphatic aldehydes such as formaldehyde, paraformaldehyde, acetoaldehyde, and propylaldehyde; unsaturated aliphatic aldehydes such as acrolein and methacrolein; heterocyclic aldehydes such as furfural; aromatic aldehydes such as benzaldehyde, naphthylaldehyde, and anthraldehyde, etc., and especially preferred are formaldehyde and paraformaldehyde. These can be used as a single kind alone or two kinds or more mixed.

In the condensation reaction, the amount of the aldehyde used is usually 1–10,000 parts by weight per 100 parts by weight of the precursor polymer.

Also, in this condensation reaction, an aromatic hydrocarbon may be added as another cocondensation component. In this case, the aromatic hydrocarbon is used as a reactive component together with the precursor polymer. The condensation reaction in this case is performed by mixing the precursor polymer, aromatic hydrocarbon, and aldehyde, and heating them with no solvent or in a solvent in the presence of an acid catalyst.

As the aromatic hydrocarbon, any aromatic hydrocarbon cocondensable with the acenaphthylene can be used. For example, listed are unsubstituted aromatic hydrocarbons such as benzene, naphthalene, anthracene, phenanthrene, and acenaphthene; alkyl substituted aromatic hydrocarbons such as toluene, m-xylene, p-xylene, and 1-methylnaphthalene; hydroxy substituted aromatic hydrocarbons such as phenol, cresol, 1-naphthol, bisphenols, and polyphenol; carboxyl substituted aromatic hydrocarbons such as benzoic acid, 1-naphtalenecarboxylic acid, and 9-anthracenecarboxylic acid; amino substituted aromatic hydrocarbons such as aniline; and halogenated aromatic hydrocarbons such as chlorobenzene and bromobenzene. These can be used as a single kind alone or two kinds or more mixed.

In the condensation reaction, the amounts of the aromatic and aldehyde used are usually 1–10,000 parts by weight or less and 1–1,000 parts by weight, respectively, per 100 parts by weight of the precursor polymer.

As the acid catalyst used in the condensation reaction, mineral acids such as sulfuric acid, phosphoric acid, and perchloric acid; organic sulfonic acids such as p-toluenesulfonic acid; and carboxylic acids such as formic acid and oxalic acid are used for example. The amount of acid catalyst used is selected in various kinds according to the kind of the acid used. Usually, it is 0.001–10,000 parts by weight, preferably 0.01–1,000 parts by weight per 100 parts by weight of acenaphthylenes.

Although the above condensation reaction can be performed with no solvent, it is usually performed with a solvent. As the solvent, can be used those that do not inhibit the reaction. For example, solvents used for resins for which an aldehyde's used as a raw material, such as phenol resin, melanin resin, and amino resin can be used. To be specific, listed are cyclic ethers such as tetrahydrofuran and dioxan in addition to the solvents used for the composition of this invention described later. If the used acid catalyst is a liquid-state one such as formic acid, it can also be given a role as a solvent.

The reaction temperature during condensation is usually 40° C.–200° C. Although various kinds of reaction time are selected according to the reaction temperature, it is usually 30 minutes –72 hours.

The Mw of the polymer (A) obtained in the above way is usually 1,000–100,000, preferably 5,000–50,000.

(Synthesis Process 2)

This process comprises:

the step(a) of cocondensing an acenaphthylene with an aldehyde in the presence of an acid catalyst or cocondensing it with another cocondensable component, a precursor condensate having the structural unit represented by the following formula (4), and the step(b) of homopolymerizing this precursor condensate alone or copolymerizing it with another copolymerizable monomer to produce the polymer (A).

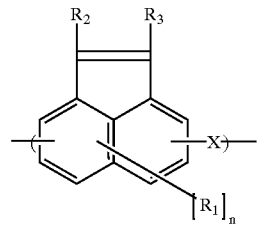

(4)

wherein $R_1$–$R_3$, n, and X are the same as described above.

Step(a):

First, the precursor condensate having the structural unit represented by the formula (4) is obtained by cocondensing an acenaphthylene and an aldehyde or adding another cocondensable aromatic and cocondensing them. As the acenaphthylene, aldehyde, and aromatic used for synthesizing the precursor condensate, those exemplified in respect of the synthesis process 1 can be used. The condensation conditions for obtaining the precursor condensate are the same as in the condensation of the precursor polymer.

Although the Mw of the precursor condensate is selected according to the desired characteristics of the anti-reflection coating, it is usually 100–10,000, preferably 2,000–5,000.

Step(b):

Next, by homopolymerizing the precursor condensate or copolymerizing it with another copolymerizable monomer, the polymer (A) is obtained. As the monomers used for the polymerization reaction, those listed in respect of the synthesis process 1 can be used. The polymerization conditions of the precursor condensate are the same as in the polymerization of the acenaphthylene.

[Solvents]

In the composition of this invention contained is a solvent other than the polymer (A). As this solvent, listed are solvents that can dissolve components of the composition which was described above and will be described later, for example, ethylene glycol monoalkyl ethers such as ethylene glycol monomethyl ether, ethylene glycol monoethyl ether, ethylene glycol monopropyl ether, and ethylene glycol monobutyl ether; ethylene glycol monoalkyl ether acetates such as ethylene glycol monomethyl ether acetate, ethylene glycol monoethyl ether acetate, ethylene glycol monopropyl ether acetate, and ethylene glycol monobutyl ether acetate; diethylene glycol dialkyl ethers such as diethylene glycol dimethyl ether, diethylene glycol diethyl ether, diethylene glycol dipropyl ether, and diethylene glycol dibutyl ether; triethylene glycol dialkyl ethers such as triethylene glycol dimethyl-ether, and triethylene glycol diethyl ether; propylene glycol monoalkyl ethers such as propylene glycol monomethyl ether, propylene glycol monoethyl ether, propylene glycol monopropyl ether, and propylene glycol monobutyl ether; propylene glycol dialkyl ethers such as propylene glycol dimethyl ether, propylene glycol diethyl ether, propylene glycol dipropyl ether, and propylene glycol dibutyl ether; propylene glycol monoalkyl ether acetates such as propylene glycol monomethyl ether acetate, propylene glycol monoethyl ether acetate, propylene glycol monopropyl ether acetate, and propylene glycol monobutyl ether acetate; lactates such as methyl lactate, ethyl lactate, n-propyl lactate, isopropyl lactate, n-butyl lactate, and n-isobutyl lactate; aliphatic carboxylates such as methyl formate, ethyl formate, n-propyl formate, isopropyl formate, n-butyl formate, isobutyl formate, n-amyl formate, isoamyl formate, methyl acetate, ethyl acetate, butyl acetate, n-amyl acetate, isoamyl acetate, n-hexyl acetate, methyl propionate, ethyl propionate, n-propyl propionate, isopropyl propionate, n-butyl propionate, isobutyl propionate, methyl butyrate, ethyl butyrate, n-propyl butyrate, isopropyl butyrate, n-butyl butyrate, isobutyl butyrate; other esters such as ethyl hydroxyacetate, ethyl 2-hydroxy-2-methyl propionate, methyl 3-methoxy-2-methyl propionate, methyl 2-hydroxy-3-methyl butyrate, ethyl methoxyacetate, ethyl ethoxyacetate, methyl 3-methoxy propionate, ethyl 3-ethoxy propionate, ethyl 3-methoxy propionate, 3-methoxypropyl acetate, 3-methoxybutyl acetate, 3-methyl-3-methoxybutyl acetate, 3-methyl-3-methoxybutyl propionate, 3-methyl-3-methoxybutyl butylate, methyl acetoacetate, methyl pyruvate, and ethyl pyruvate; aromatic hydrocarbons such as toluene and xylene; ketones such as methyl ethyl ketone, methyl n-amyl ketone, methyl propyl ketone, methyl butyl ketone, 2-heptanone, 3-heptanone, 4-heptanone, and cyclohexanone; N-methylformamide, N,N-dimethylformamide, N-methylacetoamide, N,N-dimethylacetoamide, and N-methylpyrrolidone; and lactones such as γ-butyrolactone. From these solvents, one or more solvents are selected appropriately and used. As preferred solvents among these, listed are ethylene glycol monoethyl ether acetate, ethyl lactate, ethyl 3-ethoxy propionate, methyl 3-methoxy propionate, methyl n-amyl kenone, cyclohexanone, 2-heptanone, etc. These solvents are used as a single kind alone or two kinds or more mixed.

The amount of the solvent to add is in the range such that the solid content in the obtained composition becomes usually about 0.01–70 wt. %, preferably 0.05–60 wt. %, and more preferably 0.1–50 wt. %.

[Other Ingredients]

In the composition of this invention, crosslinking agents, binder resins, and various kinds of additives can be added as far as they do not damage the desired effects of this invention.

(Crosslinking Agents)

A crosslinking agent plays a role of preventing intermixing from occurring between an anti-reflection coating obtained by applying the composition of this invention on a semiconductor substrate and a resist film applied/formed on it. It also plays a role of preventing cracks after the application.

As the crosslinking agents, polynuclear phenols and various kinds of commercial hardeners can be used. As the polynuclear phenol, listed as examples are binuclear phenols such as (1,1'-bisphenyl)-4,4'-diol, methylene bisphenol, and 4,4'-ethylidene bisphenol; trinuclear phenols such as 4,4', 4"-methylidene trisphenol and 4,4'-[1-[4-[1-(4-hydroxyphenyl)-1-methylethyl]phenyl]ethylidene] bisphenol; and polyphenols such as Novolak, and among these polynuclear phenols especially 4,4'-[1-[4-[1-(4-hydroxyphenyl)-1-methylethyl]phenyl]ethylidene] bisphenol and Novolak are preferably used.

As the hardener, listed as examples are diisocyanates such as tolylene diisocyanate, diphenylmethane diisocyanate, hexamethylene diisocyanate, and cyclohexane diisocyanate; epoxy compounds such as Epicoat 812, 815, 826, 828, 834, 836, 871, 1001, 1004, 1007, 1009, and 1031 (product names manufactured by Yuka Shell Epoxy); Araldite 6600, 6700, 6800, 502, 6071, 6084, 6097, and 6099 (product names manufactured by Ciba-Geigy); DER331, 332, 333, 661, 644, and 667 (product names manufactured by The Dow Chemical Company); melamine-based hardeners such as Saimer 300, 301, 303, 350, 370, 771, 325, 327, 703, 712, 701, 272, and 202; Mycoat 506, and 508 (product names manufactured by Mitsui Cyanamid); benzoguanamine-based hardeners such as Saimer 1123, 1123-10, and 1128; Mycoat 102, 105, 106, and 130 (product names manufactured by Mitsui Cyanamid); glycoluril-based hardeners such as Saimer 1170, and 1172; and Nikalac 2702 (product names manufactured by SANWA CHEMICAL).

The amount of crosslinking agent to add is usually 5,000 parts by weight or less per 1000 parts by weight of solid matter of anti-reflection coating-forming composition, preferably 1,000 parts by weight or less.

(Binder Resins)

As the binder resin, various kinds of thermoplastic and thermosetting synthetic resins can be used. As examples of thermoplastic resins, listed are α-olefin polymers such as polyethylene, polypropylene, poly-1-butene, poly-1-pentene, poly-1-hexene, poly-1-heptene, poly-1-octene, poly-1-decene, poly-1-dodecene, poly-1-tetradecene, poly-1-hexadecene, poly-1-octadecene, and polyvinyl cycloalkanes; polymers of an α,β-unsaturated aldehyde such as poly-1,4-pentadiene, poly-1,4-hexadiene, poly-1,5-hexadiene, and poly-1,7-o-chloracrolein; polymers of an α,β-unsaturated ketone such as polymethyl vinyl ketone, polyaromatic vinyl ketone, and polycyclo vinyl ketone; polymers of an α,β-unsaturated acid derivative such as poly(meth)acrylic acid, salts of poly(meth)acrylic acid, esters of poly(meth)acrylic acid, and halides of poly(meth)acrylic acid; polymers of an α,β-unsaturated anhydride such as poly(meth)acrylic anhydride and polyanhydrous maleic acid; unsaturated polybasic acid ester polymers such as diester polymethylene malonate and diester polyitaconic acid diester; diolefinic acid ester polymers such as polysorbic acid ester and muconic acid ester; α,β-unsaturated acid thioester polymers such as polyacrylic acid thioester, methacrylic acid thioester, and α-chloracrylic acid thioester; polymers of an acrylonitrile derivative such as polyacrylonitrile and polymethacrylonitrile; polymers of an acrylamide derivative such as polyacrylamide and polymethacrylamide; styryl metal compound polymers; polyvinyloxy metal compounds; polyimines; polyethers such as polyphenylene oxide, poly-1,3-dioxysolan, polyoxylan, polytetrahydrofuran, polytetrahydropyran; polysulfides; polysulfone amides; polypeptides; polyamides such as nylon 66, nylons 1–12; polyesters such as aliphatic polyester, aromatic polyester, alicyclic polyester, polycarbonic ester, and alkyde resin; polyureas; polysulfones; polyazines; polyamines; polyaromatic ketones; polyimides; polybenzimidazoles; polybenzoxazoles; polybenzothiazoles; polyaminotriazoles; polyoxadiazoles; polypyrazoles; polytetrazoles; polyquinoxalines; polytriazines; polybenzoxadinones; polyquinolines; and polyanthrazolines. These can be used as a single kind alone or two kinds or more mixed. The amount of these binder resins to add is usually 20 parts by weight or less per 100 parts by weight of the polymer (A), preferably 10 parts by weight or less.

As the binder resin other than these, in order to prevent intermixing with a resist, preferably used is a thermosetting resin that is heated, after being applied onto a substrate, to become hardened and insoluble in solvents.

As the thermosetting resin, listed as examples are thermosetting acryl resin, phenol resin, urea resin, melamine resin, amino resin, aromatic hydrocarbon resin, epoxy resin, alkyd resin, etc. These can be used as a single kind alone or two kinds or more mixed.

(Other Additives)

As other additives, listed as examples are radiation absorbents, surfactants, acid generators, etc.

As the radiation absorbent, various kinds of radiation absorbing compounds can be used, and listed as examples are dyes such as oil soluble dye, disperse dye, basic dye, methine dye, pyrazole dye, imidazole dye, and hydroxy azo dye; fluorescent whitening agents such as bixin derivatives, norbixin, stilbene, 4,4'-diaminostilbene derivatives, cumarin derivatives, and pyrazoline derivatives; ultraviolet ray absorbents such as hydroxy azo dye, Tinuvin 234 (product name manufactured by Ciba-Geigy), and Tinuvin 1130 (product name manufactured by Ciba-Geigy); and aromatic compounds such as anthracene derivatives and anthraquinone. These radiation absorbents can be used as a single kind alone or two kinds or more mixed. The amount of radiation absorbent to add is usually 100 parts by weight or less per 100 parts by weight of the solid matter of anti-reflection coating-forming composition, preferably 50 parts by weight or less.

A surfactant has the effect of improving applicability, striation, wetness, developability, etc. As the surfactant, listed as examples are nonion surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, and polyethylene glycol distearate, and as commercial examples listed are KP341 (product name manufactured by Shin-Etsu Chemical Co., Ltd.) which is an organosiloxane polymer, Polyflow No. 75, and No. 95 (product names manufactured by KYOEISHA CHEMICAL CO, LTD), Eftop EF101, EF204, EF303, and EF352 (product names manufactured by Tochem Products), Megafac F171, F172, and F173 (product names manufactured by DAINIPPON INK AND CHEMICALS, INCORPORATED), Florade FC430, FC431, FC135, and FC93 (product names manufactured by SUMITOMO 3M Limited); Asahi Guard AG710; Surfron S382, SC101, SC102, SC103, SC104, SC105, and SC106 (product names manufactured by Asahi Glass), etc. which are (meth)acrylic acid (co)polymers. These can be used as a single kind alone or two kinds or more combined. The amount of an surfactant to add is 15 parts by weight or less per 100 parts by weight of the solid matter of anti-reflection coating composition, preferably 10 parts by weight or less.

As the acid generator, photo-acid generators and thermoacid generators can be used, and may be used in combination.

As the photo-acid generator, listed for example are onium salt photo-acid generators such as diphenyl iodonium trifluoromethane sulfonate, diphenyl iodonium pyrene sulfonate, diphenyl iodonium dodecylbenzene sulfonate, diphenyl iodonium nanofluoro-n-butane sulfonate, bis(4-t-butylephenyl)iodonium trifluoromethane sulfonate, bis(4-t-butylephenyl)iodonium dodecylbenzene sulfonate, bis(4-t-butylephenyl)iodonium camphor sulfonate, bis(4-t-butylephenyl)iodonium naphthalene sulfonate, bis(4-t-butylephenyl)iodonium hexafluoroantimonate, bis(4-t-butylephenyl)iodonium nonafluoro-n-butane sulfonate, triphenyl sulfonium trifluoromethane sulfonate, triphenyl sulfonium hexafluoroantimonate, triphenyl sulfonium naphthalene sulfonate, triphenyl sulfonium nonafluoro-n-butane sulfonate, (hydroxyphenyl)benzene methyl sulfonium toluene sulfonate, cyclohexyl methyl (2-oxocyclohexyl), sulfonium trifluoro methane sulfonate, dicyclohexyl (2-oxocyclo hexyl)sulfonium trifluoromethane sulfonate, dimethyl (2-oxocyclohexyl)sulfonium trifluoromethane sulfonate, diphenyl iodonium hexafluoroantimonate, triphenyl sulfonium camphor sulfonate, (4-hydroxyphenyl)benzyl methyl sulfonium toluene sulfonate, 1-naphthyl dimethyl sulfonium trifluoromethane sulfonate, 1-naphthyl diethyl sulfonium trifluoromethane sulfonate, 4-cyano-1-naphthyl dimethyl sulfonium trifluoro methane sulfonate, 4-nitro-1-naphthyl dimethyl sulfonium trifluoromethane sulfonate, 4-methyl-1-naphthyl dimethyl sulfonium trifluoromethane sulfonate, 4-cyano-1-naphthyl diethyl sulfonium trifluoromethane sulfonate, 4-nitro-1-naphthyl diethyl sulfonium trifluoromethane sulfonate, 4-methyl-1-naphthyl diethyl sulfonium trifluoromethane sulfonate, 4-hydroxy-1-naphthyl dimethyl sulfonium trifluoromethane sulfonate, 4-hydroxy-1-naphthyl tetrahydrothiophenium trifluoromethane sulfonate, 4-methoxy-1-naphthyl tetrahydrothiophenium trifluoromethane sulfonate, 4-ethoxy-1-naphthyl tetrahydrothiophenium trifluoromethane sulfonate, 4-methoxymethoxy-1-naphthyl tetrahydrothiophenium trifluoromethane sulfonate, 4-ethoxymethoxy-1-naphthyltetrahydrothiophenium tifluoromethane sulfonate, 4-(1-methoxyethoxy)-1-naphthyl tetrahydrothiophenium trifluoromethane sulfonate, 4-(2-methoxyethoxy)-1-naphthyl tetrahydrothiophenium trifluoromethane sulfonate, 4-methoxycarbonyloxy-1-naphthyl tetrahydrothiophenium trifluoromethane sulfonate, 4-ethoxycarbonyloxy-1-naphthyl tetrahydrothiophenium trifluoromethane sulfonate, 4-n-propoxycarbonyloxy-1-naphthyl tetrahydrothiophenium trifluoromethane sulfonate, 4-i-propoxycarbonyloxy-1-naphthyl tetrahydrothiophenium trifluoromethane sulfonate, 4-n-butoxycarbonyloxy-1-naphthyl tetrahydrothiophenium trifluoromethane sulfonate, 4-t-butoxycarbonyloxy-1-naphthyl tetrahydrothiophenium trifluoromethane sulfonate, 4-(2-tetrahydrofuranyloxy)-1-naphthyl tetrahydrothiophenium trifluoromethane sulfonate, 4-(2-tetrahydropyranyloxy)-1-naphthyl tetrahydrothiophenium trifluoromethane sulfonate, 4-benzyloxy-1-naphthyl tetrahydrothiophenium trifluoromethane sulfonate, and 1-(naphthyl acetomethyl)tetrahydrothiophenium trifluoromethane sulfonate; halogen-containing compound photo-acid generators such as phenyl-bis(trichloromethyl)-s-triazine, methoxy phenyl-bis(trichloromethyl)-s-triazine, and naphthyl-bis(trichloromethyl)-s-triazine; diazoketone compound photo-acid generators such as 1,2,-naphthoquinone diazide-4-sulfonyl chloride, 1,2-naphthoquinone diazide-5-sulfonyl chloride, and 1,2-naphthoquinone diazide-4-sulfonic acid ester or 1,2-naphthoquinone diazide-5-sulfonic acid ester of 2,3,4,4'-tetrabenzo phenone; sulfonic acid compound photo-acid generators such as 4-trisphenacyl sulfone, mesityl phenacyl sulfone, and bis(phenyl sulfonyl)methane; and sulfonic acid compound photo-acid generators such as benzoine tosylate, tristrifluoromethane sulfonate of pyrogallol, nitrobenzyl-9, 10-diethoxyanthracene-2-sulfonate, trifluoromethane sulfonyl bicyclo[2.2.1]hept-5-ene-2,3-dicarbodiimide, N-hydroxysuccine imide trifluoromethane sulfonate, and 1,8-naphthalene dicarbonic acid imide trifluoromethane sulfonate. These can be used as a single kind alone or two kinds or more combined.

As the thermoacid generator, listed for example are 2,4, 4,6-tetrabromocylcohexadienone, benzoine tosylate, 2-nitrobenzyl tosylate, and alkyl sulfonate. These can be used singly or as two kinds or more combined.

The amount of the acid generator to add is usually 5000 parts by weight or less per 100 parts by weight of the solid matter of anti-reflection coating-forming composition, preferably 0.1 part by weight or more and 1000 parts by weight or less.

Further as other optical additives, reservative/stabilizer, antifoaming agent, adhesion aid, etc. can be listed.

[How to Use the Composition]

The composition of this invention is used for forming an anti-reflection coating when forming a resist pattern on a semiconductor substrate. To be specific, it is used, for example, as follows. Namely, a resist pattern forming process usually includes 1) the step of applying the anti-reflection coating-forming composition of this invention onto a substrate and baking the applied coating film to form an anti-reflection coating, 2) the step of applying a resist composition solution on the anti-reflection coating and baking the obtained coating film to form a resist film, 3) the step of exposing the resist film to radiation via an exposure mask, 4) the step of developing the exposed resist film, and 5) the step of etching the anti-reflection coating.

The coating thickness of the anti-reflection coating formed in the first step is 100–5,000 angstrom for example, and the composition is applied by the methods such as spin coating, flow extending coating, and rolling coating. Next, it is baked to thermo-harden the anti-reflection coating-forming composition. The baking temperature is about 90–350° C. for example. As the substrate, silicon wafer, wafer coated with aluminum, etc. are listed.

In the second step, the resist composition solution is applied so that the obtained resist film on the anti-reflection coating has a specified coating thickness, and the solvent in the obtained coat is vaporized by baking it to form a resist film. The baking temperature at this step is appropriately adjusted according to the kind etc. of the resist composition used. It is normally about 30–200° C., preferably 50–150° C.

In order to form a resist film on an anti-reflection coating, after dissolving the resist composition in an appropriate solution so that the solid matter concentration becomes 5–50 wt. % for example, the solution thus obtained is filtered with a filter of about 0.2 $\mu$m opening for example to prepare a composition solution, and this is applied onto the anti-reflection coating by methods such as spin coating, flow extending coating, and roll coating. In this case, a commercial resist solution can be used in its existent state.

As the resist composition used above, listed for example are a positive resist composition made of alkali soluble resin and a quinone diazide photosensitive agent, a negative resist composition made of an alkali soluble resin and a radiation-sensitive crosslinker, and a positive or negative chemically amplified resist composition containing a radiation-sensitive acid generator.

The radiation used for exposure in the third step is selected appropriately from a visible ray, an ultraviolet ray, a far-ultraviolet ray, an X ray, an electron beam, a $\gamma$ ray, a molecular beam, an ion beam, and the like, according to the kind of resist used. Among these types of radiation, the preferred one is the far-infrared ray, especially the KrF excimer laser (248 nm) and the ArF excimer laser (193 nm) are preferred.

Next, in the fourth step, the resist after exposure is developed. Afterwards a desired resist pattern is obtained by cleaning and drying. During the step, in order to improve the resolution, pattern profile, and developability, baking may be done after exposure before developing.

Lastly in the fifth step, dry etching of the anti-reflection coating is performed using gas plasma, such as oxygen plasma with the resist pattern as a mask, forming a resist pattern for processing the substrate As the developer used in the step, listed for example are alkaline solutions such as sodium hydroxide, potassium hydroxide, sodium carbonate, sodium silicate, sodium metasilicate, ammonia, ethyl amine, n-propyl amine, diethyl amine, di-n-propyl amine, triethyl amine, methyl diethyl amine, dimethyl ethanol amine, triethanol amine, tetramethyl ammonium hydroxide, tetraethyl ammonium hydroxide, pyrrole, piperidine, choline, 1,8-diazabicyclo-[5.4.0]-7-undecene, and 1,5-diazabicyclo-[4.3.0]-5-nonane. Also, to these developers a water-soluble organic solvent such as alcohols such as methanol and ethanol and surfactants can be added in an appropriate amount.

EXAMPLES

The present invention is described hereafter with reference to examples. However, this invention is not limited to these examples. In the following explanation, "part(s)" indicates "part(s) by weight" unless specified otherwise.

In the following synthesis examples, Mw of the obtained resins were measured by the gel permeation chromatography (Detector: Differential refractometer) using monodiperse polystyrene as the standard and the GPC columns manufactured by Toso Corp. (G2000HXL: 2 pieces, G3000HXL: 1 piece) under an analysis condition of flow rate: 1.0 ml/minute, eluting solvent: tetrahydrofuran, and column temperature: 40°.

Evaluation of the performance of the anti-reflection coating-forming composition was performed in the following procedure.

Measurements of Optical Properties:

After spin coating a silicon wafer of 8" with an anti-reflection coating-forming composition, baking was accomplished on a hot plate at 345° C. for 120 seconds to form anti-reflection coating of 0.1 $\mu$m in thickness. Using a spectroscopic ellipsometer UV-1280E manufactured by KLA-TENCOR Corp., refractive index (n value) and absorbance (k value) at 248 nm were measured. Also, using a spectroscopic ellipsometer MOSS-ESVG DEEP UV manufactured by SOPRA Corp., the n value and k value at 193 nm were measured.

Formation of a Positive Resist Pattern for KrF:

After an 8" silicon wafer is spin-coated with an anti-reflection coating-forming composition so that a coating of 600 Å in thickness is obtained, baking is accomplished on a hot plate at 345° C. for 120 seconds, forming an anti-reflection coating. Subsequently, the anti-reflection coating is spin-coated with a resist solution for KrF (product name KRF M20G manufactured by JSR Corp.) so that a resist film of 0.61 $\mu$m in thickness is obtained, followed by being baked on a hot plate at 140° C. for one minute, forming a resist film. Next, using a stepper NSR2005EX12B (wavelength 248 nm) manufactured by Nikon K.K. exposure is performed for just the exposure time for forming a line-and-space pattern of 0.22 $\mu$m in width with line widths of 1 vs. 1. Next, after baking on a hot plate at 140° C. for 90 seconds, it is developed with 2.38 wt. % tetramethylammonium hydroxide solution at 23° C. for 30 seconds, washed with water, and dried, forming a positive resist pattern.

Formation of a Positive Resist Pattern for ArF:

After an 8" silicon wafer is spin-coated with an anti-reflection coating-forming composition so that a coating of 600 Å in thickness is obtained, baking is accomplished on a hot plate at 345° C. for 120 seconds, forming an anti-reflection coating. Subsequently, the anti-reflection coating is spin-coated with a resist solution for ArF obtained in Reference Example 1, described below, so that a resist film of 0.5 μm in thickness is obtained, and afterwards it is baked on a hot plate at 130° C. for 90 seconds, forming a resist film. Next, exposure is performed via a masking pattern by an ArF excimer laser exposure device (lens numeral aperture: 0.60; exposure wavelength 193 nm) manufactured by ISI Corp. Next, after baking on a hot plate at 130° C. for 90 seconds, it is developed with 2.38 wt. % tetramethylammonium hydroxide solution at 25° C. for one minute, washed with water, and dried, forming a positive resist pattern.

Intermixing Prevention Effect:

Using the conditions stated above, formation, exposure, and development of an anti-reflection coating and a resist film are performed. The degree of skirt dragging at contact points between the remaining part of the resist film and the anti-reflection coating after development is examined using a canning electron microscope.

Standing Wave Prevention Effect:

According to the condition, formation, exposure, and development of an anti-reflection coating and a resist film are performed. Afterwards, the presence/absence of influence of standing wave on the resist film is examined using a canning electron microscope.

Reference Example 1

Preparation of a Resist Solution for ArF

In a separable flask with a reflux tube attached, put under nitrogen gas flow are 8-methyl-8-t-butoxycarbonylmethoxy carbonyltetracyclo[4.4.0.1$^{2,5}$.1$^{7,10}$]dodec-3-ene 29 parts, 8-hydroxytetracyclo[4.4.0.1$^{2,5}$.1$^{7,10}$]dodec-3-ene(10 parts), maleic anhydride (18 parts), 2,5-dimethyl-2,5-hexane diol diacrylate (4 parts), 5-dodecyl captane (1 part), azobisisobutylonitrile (4 parts), and 1,2-dietoxyethane (60 parts), followed by polymerization at 70° C. for six hours. After polymerization is completed, the reaction solution is poured into a large amount of n-hexane/i-propyl alcohol (wt. ratio= 1/1), and the resin is thereby coagulated, and after the coagulated resin is washed several times with the same mixed solvent as mentioned above, it is vacuum-dried, obtaining at 60% yield a copolymer in which the contents of the structural units expressed in the following formulas (a), (b), and (c) are 64 mol %, 18 mol %, and 18 mol %, respectively, and Mw is 27,000.

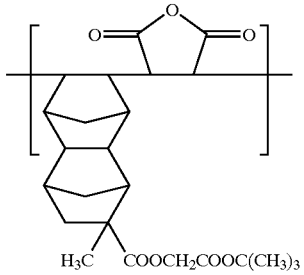

(a)

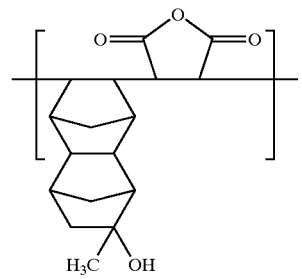

(b)

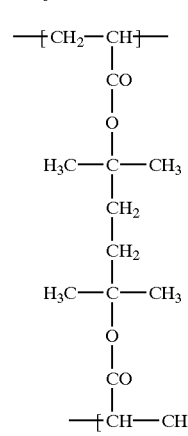

(c)

The obtained copolymer (80 parts), 4-methoxy-1-naphthyltetrahydrothiphenium nonafluoro-n-butanesulfonate (1.5 parts), and tri-n-octylamine (0.04 part) are dissolved in propylene glycol monoethyl ether acetate (533 parts), preparing an ArF resist solution.

Synthesis Example 1

Synthesis of Polymer (A)

In a separable flask with a thermometer installed, put under nitrogen are acenaphthylene (100 parts), toluene (78 parts), dioxan (52 parts), and azobisisobutyronitrile (AIBN) (3 parts), and the contents were stirred at 70° C. for five hours. Next, p-toluene sulfonic acid 1 hydrate (5.2 parts) and paraformaldehyde (40 parts) are added, and the temperature was raised to 120° C., and further the contents were stirred for six hours. The obtained, reaction solution is poured into a large amount of isopropanol, and the precipitated resin was collected by filtering. This is vacuum-dried at 40° C., obtaining a polymer (A). The obtained resin had an Mw of 22,000 (in terms of polystyrene), and a polymer having the structure represented by the following formula (5) was confirmed from a result of $^1$H-NMR.

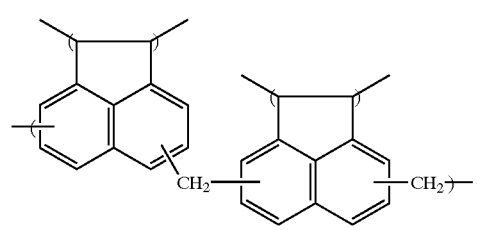

(5)

Synthesis Example 2

Synthesis of Polymer (A')

In a separable flask with a thermometer installed, acenaphthylene (100 parts), toluene (78 parts), dioxane (52 parts), p-toluene sulfonic acid 1 hydrate (5.2 parts), and paraformaldehyde (40 parts) were added, and the temperature was raised to 120° C., and the contents were stirred for six hours. Next, after lowering the internal temperature to 70° C., azobisisobutyronitrile (AIBN) (3 parts) was put under nitrogen, and further the contents were stirred at that temperature for five hours.

The obtained, reaction solution was poured into a large amount of isopropanol, and the precipitated resin was collected by filtering. This was vacuum-dried at 40° C., obtaining a polymer (A). The obtained resin had an Mw of 20,000 (in terms of polystyrene), and a polymer having the structure represented by the formula (5) was confirmed from a result of $^1$H-NMR.

Example 1

The polymer (A) prepared in Synthesis Example 1 (10 parts), bis(4-t-butylphenyl)iodonium camphorsulfonate (0.5 part), and 4,4'-[1-[4-[1-(4-hydroxyphenyl)-1-methylethyl]phenyl]ethylidene]bisphenol (0.5 part) were dissolved in cyclohexanone (89 parts), and the obtained solution was filtered with a membrane filter with a pore opening of 0.1 μm, preparing an anti-reflection coating-forming composition. Next, a performance evaluation of the obtained composition was conducted. The evaluation results are listed in Table 1.

Example 2

An anti-reflection coating-forming composition was prepared in the same way as in example 1, except that 4,4'-[1-[4-[1-(4-hydroxyphenyl)-1-methylethyl]phenyl]ethylidene]bisphenol is replaced with a novolak resin with an Mw of 10,000 in terms of polystyrene. A performance evaluation was conducted of the obtained composition as in the above. The evaluation results are given in Table 1.

Example 3

An anti-reflection coating-forming composition was prepared in the same way as in Example 1 except that 4,4'-[1-[4-[1-(4-hydroxyphenyl)-1-methylethyl]phenyl]ethylidene]bisphenol was replaced with a glycoluryl hardener (product name: Nicalac N-2702 manufactured by Sanwa Chemical). A performance evaluation was conducted of the obtained composition as in the above. The evaluation results are listed in Table 1.

Example 4

A lower-layer coating-forming composition was prepared in the same way as in Example 1 except that the polymer (A) obtained in Synthesis Example 1 was replaced with the polymer (A') obtained in Synthesis Example 2. A performance evaluation of the obtained composition was conducted as in the above. The evaluation results are given in Table 1.

Example 5

A lower-layer coating-forming composition was prepared in the same way as in Example 2 except that the polymer (A) obtained in the Synthesis Example 1 was replaced with the polymer (A') obtained in the Synthesis Example 2. A performance evaluation of the obtained composition was conducted as in the above. The evaluation results are listed in Table 1.

Example 6

A lower-layer coating-forming composition was prepared in the same way as in Example 3 except that the polymer (A) obtained in the Synthesis Example 1 was replaced with the polymer (A') obtained in the Synthesis Example 2. A performance evaluation of the obtained composition was conducted as in the above. The evaluation results are listed in Table 1.

Comparative Example 1

A performance evaluation was conducted in the same way as in examples 1–3, except that no anti-reflection coating-forming composition was used. The evaluation results are listed in Table 1.

TABLE 1

| | Optical properties (248 nm) | | Optical properties (193 nm) | | Influence of standing wave | | Occurrence of inter-mixing | |
|---|---|---|---|---|---|---|---|---|
| | n value | k value | n value | k value | KrF | ArF | KrF | ArF |
| Example 1 | 1.97 | 0.21 | 1.42 | 0.44 | No | No | No | No |
| Example 2 | 1.98 | 0.21 | 1.42 | 0.44 | No | No | No | No |
| Example 3 | 2.00 | 0.25 | 1.40 | 0.40 | No | No | No | No |
| Example 4 | 1.97 | 0.21 | 1.42 | 0.44 | No | No | No | No |
| Example 5 | 1.98 | 0.21 | 1.42 | 0.44 | No | No | No | No |
| Example 6 | 2.00 | 0.25 | 1.40 | 0.40 | No | No | No | No |
| Comparative Example 1 | — | — | — | — | Yes | Yes | Yes | Yes |

Because the anti-reflection coating formed by using the anti-reflection coating-forming composition of this invention has a high anti-reflection effect and does not generate intermixing with a resist, it can bring about a resist pattern which has excellent resolution, precision, etc. by cooperating with a positive-type or negative-type resist. Therefore, the anti-reflection coating-forming composition of this invention especially contributes greatly to the manufacturing of integrated circuits of high integration.

What is claimed is:

1. An anti-reflection coating-forming composition comprising a polymer and a solvent, said polymer having a structural unit represented by the following formula (1):

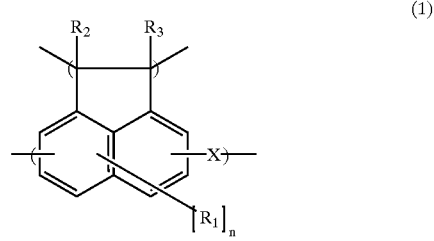

(1)

wherein $R_1$ is a monovalent atom other than a hydrogen atom or a monovalent group, and n is an integer of 0–4, provided that when n is an integer of 2–4, a plural number of $R_1$'s are the same or different; $R_2$ and $R_3$ are each a monovalent atom or group; and X is a bivalent group.

2. The composition according to claim 1, wherein $R_1$ is a halogen atom, alkyl group, alkenyl group, nitro group, amino group, hydroxyl group, phenyl group, acyl group, carboxyl group, sulfonic acid group, or mercapto group, provided that when a plurality of $R_1$'s exist, they may be the same or different.

3. The composition according to claim 1, wherein $R_2$ and $R_3$ are each independently a hydrogen atom, halogen atom, alkyl group, alkenyl group, nitro group, amino group, hydroxyl group, phenyl group, acyl group, carboxyl group, sulfonic acid group, or mercapto group.

4. The composition according to claim 1, wherein the structural unit having the formula (1) comprises the structural unit represented by the formula (2):

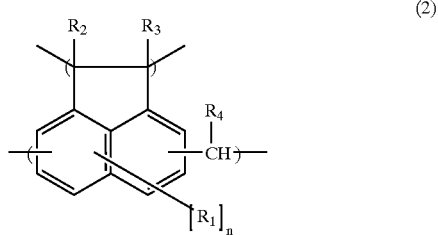

wherein $R_1$–$R_3$ and n are as defined above, and $R_4$ stands for a hydrogen atom or a monovalent organic group.

5. The composition according to claim 4, wherein the structural unit having the formula (2) accounts for at least 50 mole % in the whole structural units represented by the formula (1).

6. The composition according to claim 4, wherein $R_4$ is a straight-chain or branched-chain alkyl group with 1 to 6 carbon atoms, a straight-chain or branched-chain alkenyl group with 2 to 6 carbon atoms, an alicyclic group with 4 to 10 carbon atoms, an aromatic hydrocarbon group with 6–12 carbon atoms, or a 4–10 membered heterocyclic group.

7. The composition according to claim 1, wherein the solvent is present in such an amount that the concentration of the solid matter in the composition is in a range of 0.01 to 70% by weight.

8. The composition according to claim 7, wherein the solvent is present in such an amount that the concentration of the solid matter in the composition is in a range of 0.05 to 60% by weight.

9. The composition according to claim 1, which further comprises a crosslinking agent.

10. The composition according to claim 9, wherein the crosslinking agent is present in an amount of not greater than 5,000 parts by weight per 100 parts by weight of the solid matter in the composition.

11. The composition according to claim 1, which further comprises a binder resin.

12. The composition according to claim 11, wherein the binder resin is present in an amount of not greater than 20 parts by weight per 100 parts by weight of the polymer of the component (A).

* * * * *